United States Patent
Chinone

(10) Patent No.: US 8,637,889 B2
(45) Date of Patent: Jan. 28, 2014

(54) SEMICONDUCTOR LIGHT EMITTING DEVICE

(71) Applicant: Stanley Electric Co., Ltd., Tokyo (JP)

(72) Inventor: Takako Chinone, Tokyo (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/693,238

(22) Filed: Dec. 4, 2012

(65) Prior Publication Data
US 2013/0146917 A1    Jun. 13, 2013

(30) Foreign Application Priority Data
Dec. 9, 2011    (JP) .................................. 2011-269830

(51) Int. Cl.
*H01L 33/46* (2010.01)

(52) U.S. Cl.
USPC .............. 257/98; 257/E33.067; 257/E33.068; 438/27

(58) Field of Classification Search
USPC ................ 257/98, E33.067, E33.068; 438/27
See application file for complete search history.

(56) References Cited

U.S. PATENT DOCUMENTS 7,429,750 B2 *   9/2008   Suehiro et al. ................... 257/53
7,646,036 B2     1/2010   Kozawa et al.

FOREIGN PATENT DOCUMENTS

JP     2008-192782 A    8/2008

* cited by examiner

*Primary Examiner* — Zandra Smith
*Assistant Examiner* — Paul Patton
(74) *Attorney, Agent, or Firm* — Holtz, Holtz, Goodman & Chick, PC

(57) ABSTRACT

A semiconductor light emitting device includes: a semiconductor lamination including a first semiconductor layer of a first conductivity type, an active layer formed on the first semiconductor layer, and a second semiconductor layer of a second conductivity type formed on the active layer; a rhodium (Rh) layer formed on one surface of the semiconductor lamination; a light reflecting layer containing Ag, formed on the Rh layer and having an area smaller than the Rh layer; and a cap layer covering the light reflecting layer. Migration of Ag is suppressed.

9 Claims, 7 Drawing Sheets

SEMICONDUCTOR LIGHT EMITTING DEVICE

CROSS REFERENCE TO RELATED APPLICATION

This application is based on and claims priority of Japanese Patent Application 2011-269830, filed on Dec. 9, 2011, the entire contents of which are incorporated herein by reference.

BACKGROUND OF THE INVENTION

A) Field of the Invention

This invention relates to a semiconductor light emitting device and its manufacture.

B) Description of the Related Art

Light emitting diode (LED) utilizing nitride semiconductor, such as GaN, can emit ultraviolet light or blue light, and can emit white light by utilizing fluorescent material. LEDs capable of emitting white light of high output can be used for illumination purposes.

Recently, with the increase in the output of semiconductor light emitting devices, device structures in which semiconductor lamination is attached to and supported by a heat-dissipating and supporting substrate in view of providing electrodes on both surfaces, etc. are employed. For realizing high output, a light reflecting electrode formed of silver (Ag) or Ag alloy which contains not more than 1% of selenium (Se), palladium (Pd), gold (Au), copper (Cu), platinum (Pt), neodymium (Nd), bismuth (Bi), etc. mixed in Ag is disposed between the supporting substrate and the semiconductor lamination.

It is known that Ag has high light reflectivity, but has such property that migration, i.e. movement, of Ag ions is easy to occur, especially when a current is flowing or a temperature is raised. When migration of Ag ions occurs, phenomena that give affects to the characteristics and reliability of the device, such as leakage current, may occur.

For preventing migration of Ag ions, such countermeasures as formation of diffusion preventing layer made of high melting point metal such as Ti, Pt, or metal oxide such as indium tin oxide (ITO) is widely employed. For example, a transparent electrode of metal oxide such as ITO is formed on a nitride semiconductor layer, a Ag-containing reflecting electrode is formed on the transparent electrode, a diffusion preventing film including lamination of Ti and Pt is formed to cover the Ag-containing reflecting electrode, and a thick Au film is formed thereon (for example, see JP-A 2008-192782).

SUMMARY OF THE INVENTION

An object of this invention is to suppress migration of Ag in a semiconductor light emitting device having a Ag-containing light reflecting layer.

Another object of this invention is to suppress sulfuration of Ag in a semiconductor light emitting device having a Ag-containing light reflecting layer.

According to one aspect of this invention, a semiconductor light emitting device contains a semiconductor lamination including a first semiconductor layer of a first conductivity type, an active layer formed on the first semiconductor layer, and a second semiconductor layer of a second conductivity type formed on the active layer; a rhodium (Rh) layer formed on one surface of the semiconductor lamination; a light reflecting layer containing Ag, formed on the Rh layer and having an area smaller than the Rh layer; and a cap layer covering the light reflecting layer to encapsulate the light reflecting layer together with the Rh layer.

According to another aspect of this invention, a method for manufacturing a semiconductor light emitting device contains steps of: (a) preparing a growth substrate; (b) growing a semiconductor lamination on the growth substrate, including a first semiconductor layer of a first conductivity type, an active layer on the first semiconductor layer, and a second semiconductor layer of a second conductivity type on the active layer; (c) forming a rhodium (Rh) layer on one surface of the semiconductor lamination; (d) forming a light reflecting layer containing Ag on the Rh layer; (e) etching the light reflecting layer to pattern the light reflecting layer within area of the Rh layer; and (f) forming a cap layer covering the light reflecting layer to encapsulate the light reflecting layer together with the Rh layer.

It is possible to suppress migration of Ag in a semiconductor light emitting device having a Ag-containing light reflecting layer.

It is possible to suppress sulfuration of Ag in a semiconductor light emitting device having a Ag-containing light reflecting layer.

DESCRIPTION OF THE PREFERRED EMBODIMENTS

Figure 1:
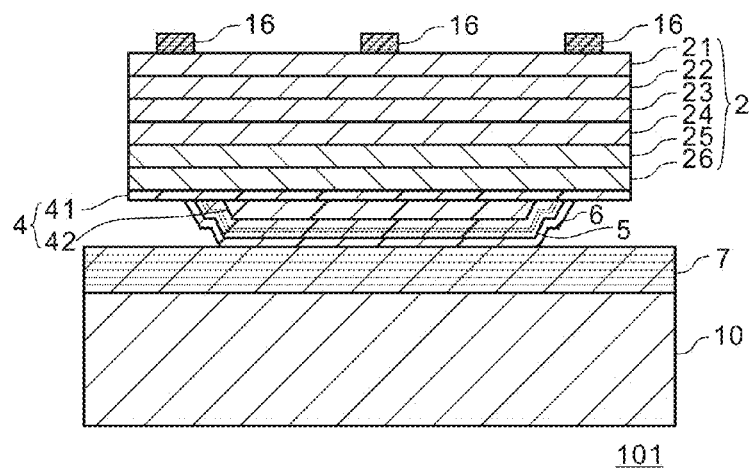
FIG. 1 is a schematic cross section illustrating device structure of a nitride semiconductor light emitting diode (LED) device 101 according to an embodiment of this invention.

FIG. 1 is a schematic cross section illustrating device structure of a nitride semiconductor light emitting diode (LED) device 101 according to an embodiment of this invention.

The nitride semiconductor light emitting diode device 101 contains a GaN series semiconductor lamination (light emitting portion) 2, containing, for example, an undoped GaN layer 21, an n-type GaN layer 22 doped with Si or the like, a strain relaxing layer 23 including lamination of GaN/InGaN, an active layer 24 including a multiple quantum well structure formed of GaN/InGaN multiple layers, a p-type AlGaN clad layer 25, and a p-type GaN contact layer 26, which are sequentially laminated in this order.

The term "GaN series semiconductor" means compound semiconductor containing Ga and N, or nitride semiconductor containing Ga as a group III element, such as GaN, AlGaN, InGaN, AlGaInN, etc.

On a surface of the GaN series semiconductor lamination 2 depicted at a lower part in the figure, a reflection electrode 4 including a rhodium (Rh) layer 41 and a silver (Ag) layer 42 formed on the Rh layer 41 is formed. A cap layer 5 including lamination of TiW/Ti/Pt, serving as Ag diffusion preventing layer which prevents diffusion of Ag, is formed to cover the reflection electrode 4, and a Au layer 6 is formed on the cap layer 5. On another surface of the GaN series semiconductor lamination 2 depicted at an upper part in the figure, an n-side electrode (wiring electrode) 16 formed of lamination of Ti/Al/Ti/Pt/Au is formed.

A silicon (Si) support substrate 10 having a eutectic layer 7 including eutectic material of, for example Pt/Ti/Ni/Au/Pt/AuSn lamination on a surface is coupled with the Au layer 6 on the cap layer 5. The Au layer 6 on the cap layer 5 and the eutectic layer 7 on the support substrate are brought to form eutectic alloy layer which is connected with the cap layer 5.

Such metals as Rh, Pt, Ni, and Ti have high adhesion characteristics with GaN series semiconductor, and can reduce the contact resistance therewith. In particular, Rh can provide a relatively high reflectivity when combined with a Ag layer, has a higher etching durability than Ag reflection electrode, and has sulfusion preventing function for Ag.

Although control of a Rh layer is not easy in a thickness range less than 0.1 nm (1 A), a Rh layer with a thickness of 0.1 nm (1 A) or above can improve the adhesion of Ag layer with a p-type GaN layer. When the thickness of a Rh layer is made thicker than 2 nm (20 A), the reflectivity of the reflection electrode 4 around the wavelength of 450 nm becomes less than 80%. The change in reflectivity (%) of the reflection electrode 4 with the change in the thickness of the Rh layer 41 (nm) is 92% at 0.5 nm (5A), 88% at 1 nm (10 A), and 80% at 2 nm (20 A).

The lateral resistance of a Rh thin film in a thickness range of 0.1 nm (1 A) to 1 nm (10 A) is very high. When semiconductor structure depicted in FIG. 1 having a Rh film 41 with a thickness in a range of 0.1 nm (1 A) to 1 nm (10 A) was made and measured before element isolation, electric conduction between adjacent elements through the Rh film was scarcely observed. Therefore, Rh films in this thickness range, even when peeled off in manufacturing steps, can give very small possibility of causing junction leak current.

Based on the above experimental results, the Rh film 41 having a thickness in a rage of 0.1 nm (1 A) to 1 nm (10 A), more preferably in a rage of 0.1 nm (1 A) to 0.5 nm (5 A) providing reflectivity of 90% or above, is inserted between the GaN series semiconductor lamination 2 (p-type GaN layer 26) and the Ag layer 42.

As depicted in FIG. 1, the Ag layer 42 has such a planar shape that the planar area of the Ag layer 42 decreases from the interface with the Rh layer 42 on the GaN series semiconductor lamination 2, toward the interface with the cap layer 5. In other words, the Ag layer 42 has a forwardly tapered shape in which the planar area gradually decreases with increase in the thickness from the Rh layer 41.

As described above, the etching durability of the Rh film 41 is higher than (etching rate is lower than) the Ag layer 42, and the Rh layer when inserted between the GaN series semiconductor lamination and the Ag layer can increase the adhesion of the Ag layer with the GaN series semiconductor lamination 2, compared to the case when the Ag layer 42 is directly formed on the GaN series semiconductor lamination 2. The etching rate of the Ag layer 42 gradually become smaller when approaching to the interface with the Rh film 41, becoming more hard to be side-etched. Thus, it is considered that the etched Ag layer has a forwardly tapered cross section.

Since the Ag layer 42 has a forwardly tapered shape, the cap layer 5 formed on the Ag layer 42 can more easily cover the side wall of the Ag layer 42, compared to the case where the side wall of the Ag layer is perpendicular, or nearly perpendicular to the underlying surface. The Ag layer 42 is encapsulated by the combination of the Rh layer 41 and the cap layer 5. Thus, the Ag diffusion preventing function by the cap layer 5 improves.

The Rh layer is designed to have wider area than the Ag layer 42. In plan view, the Rh film 41 is located to enclose the whole circumference of the Ag layer 42. By such configuration, sulfurating composition entering from the edge of the cap layer 5 first reaches the Rh film prior to reaching the Ag layer. Thus, the Rh film can sufficiently exhibit sulfuration preventing function.

Now, description will be made on processes for manufacturing the nitride semiconductor light emitting device 101 according to the embodiment of this invention, referring to FIGS. 2-12.

Figure 2:
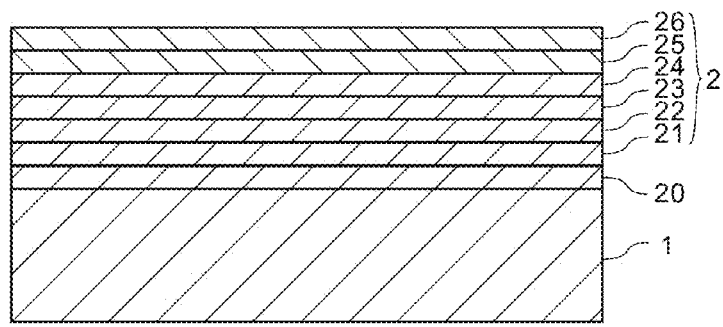
FIGS. 2-12 are schematic cross sections illustrating steps of manufacturing a nitride semiconductor light emitting diode (LED) device 101 according to the embodiment of this invention.

As illustrated in FIG. 2, a sapphire substrate (growth substrate) 1 is prepared, loaded in an organic molecule chemical vapor deposition (MOCVD) apparatus, and subjected to thermal cleaning. After thermal cleaning, a GaN buffer layer 20 is deposited on the substrate 1, for example by low temperature growth at a substrate temperature of 500 C (degrees centigrade), and then heated to 1000 C to crystallize the layer. Thereafter, GaN series semiconductor lamination layers 2 are grown on the GaN buffer layer 20.

For example, after growing the buffer layer 20, an undoped GaN layer 21 and n-type GaN layer 22 doped with Si or the like are grown at a growth temperature of 1000 C. Then, a strain relaxing layer 23 containing GaN/InGaN is grown at a growth temperature of 730 C. Subsequently, an active layer 24, for example formed of a multi-quantum well (MQW) structure including GaN/InGaN multi-layers, is grown at a growth temperature of 700 C. A p-type AlGaN clad layer 25 and a p-type GaN contact layer 26 are sequentially grown on the active layer 24. The total thickness of the buffer layer and the GaN series semiconductor lamination 2 is, for example around 6 micro-meters. The growth substrate may be formed of a GaN substrate or a SiC substrate, in place of a sapphire substrate.

Figure 3:
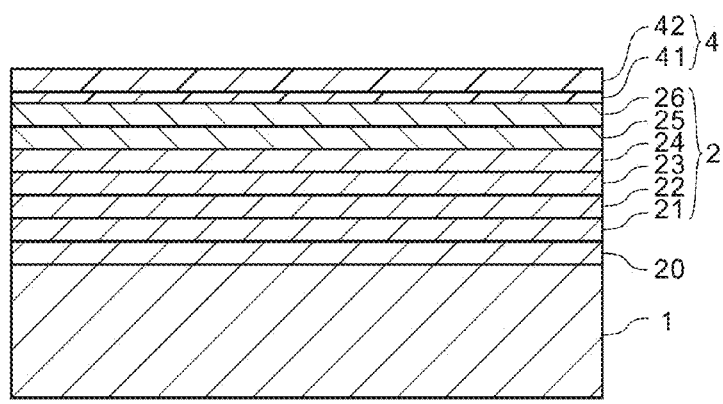

As illustrated in FIG. 3, a reflection electrode 4 is formed. For example, a Rh film 41 of about 0.5 nm (5 A) thick and a Ag layer 42 of about 300 nm (3000 A) are formed by electron beam (EB) deposition. Deposition may be done by sputtering in place of EB deposition.

Figure 4:
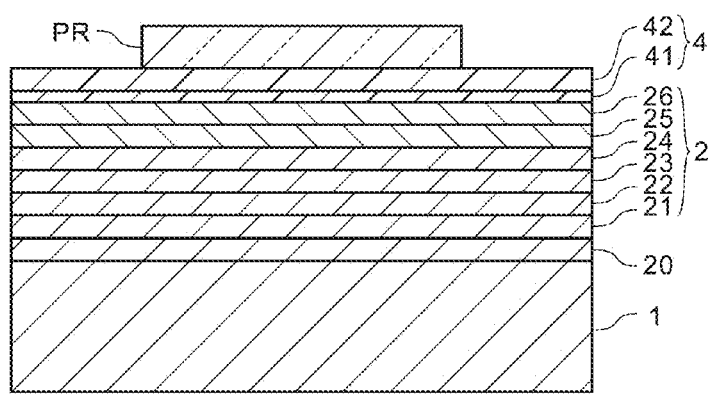

As illustrated in FIG. 4, a resist mask PR having a shape of reflection electrode is formed on the Ag layer 42.

Figure 5:
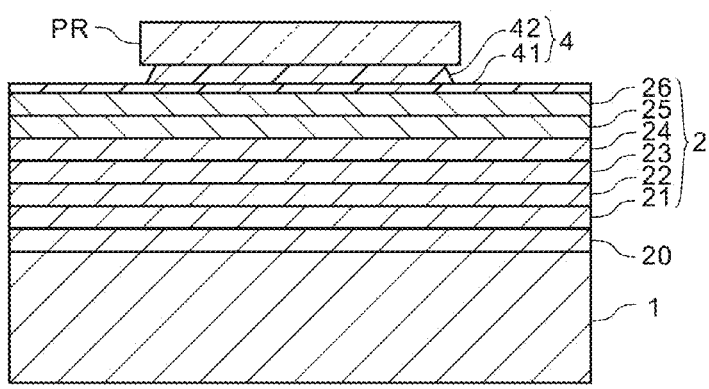

As illustrated in FIG. 5, the Ag layer 42 is etched in etchant adjusted at a mixing ration of {nitric acid:water:acetic acid: phosphoric acid}={1:1:8:10}, at 25 C for 20 seconds. After the etching, the resist mask PR is removed.

Figure 6:
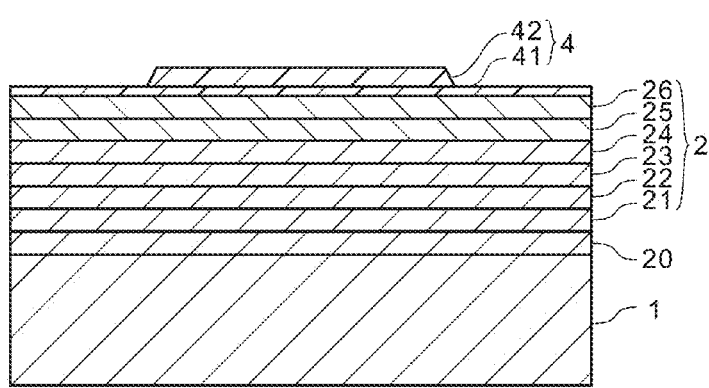

As illustrated in FIG. 6, the Ag layer 42 having a forward taper is patterned. The Rh film is not etched by the etching of the above-described conditions, and remains. The etched electrode is subjected to heat treatment at 400 C for 2 minutes in oxygen-containing gas atmosphere.

Various etchants containing nitric acid can be used. Depending on the composition of the etchant, it may be preferable to change the etching temperature and etching time. When the temperature is raised, Rh begins to be etched to some extent. Even in such case, the etching rate of Rh is far smaller than that of Ag. As a result, the Rh film remains and the area of the Rh film 41 becomes wider than the Ag layer 42.

The Rh film 41 improves adhesion of the Ag layer 42 with the p-type GaN layer 26, and has a function of transparent electrode. The Ag layer 42 has a function of light reflecting electrode. The Rh film also has a sulfuration preventing function for the Ag layer 42. The thickness of the Rh film is preferably selected in a range of 0.1 nm (1 A) to 1 nm (10 A), and more preferably in a range of 0.1 nm (1 A) to 0.5 nm (5 A), as described above.

After patterning the reflection electrode by etching, the contact resistance of the reflection electrode 4 (with a Rh film of a thickness of 0.5 nm (5 A)) was measured. A contact resistance of $5 \times 10^{-4}$ ohm*cm$^2$ was obtained. When the reflection electrode was patterned by lift-off (a resist mask of designed shape is formed on the p-type GaN layer 26 and then a reflection electrode 4 with a Rh film of a thickness of 0.5 nm (5 A) was deposited, and then the resist mask was removed together with the reflection electrode 4 on the resist mask), the contact resistance of the reflection electrode 4 was $2 \times 10^{-3}$ ohm*cm$^2$. When the Rh film 41 was not formed (the reflection electrode 4 made only of a Ag layer 42 was patterned by etching), the contact resistance was $1 \times 10^{-3}$ ohm*cm$^2$.

It was found from these experimental results that a reflecting electrode having a lower contact resistance can be provided by patterning the electrode by etching, compared to the case of patterning the electrode by lift-off.

Figure 7:
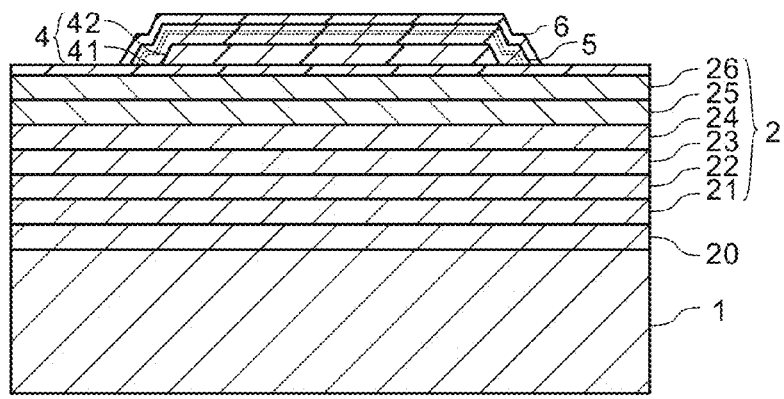

As illustrated in FIG. 7, a cap layer 5, for example including lamination of TiW (300 nm)/Ti (50 nm)/Pt (100 nm) is formed to cover the reflecting electrode 4. Then, a eutectic-forming Au layer 6 including a Au layer of a thickness around 200 nm is formed to cover the lamination of the cap layer 5.

Figure 17:
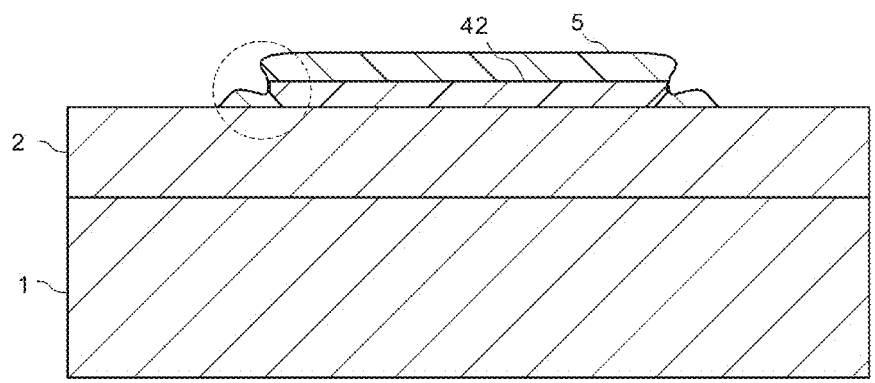
FIG. 17 is a partial schematic cross section illustrating a nitride semiconductor light emitting diode (LED) device according to a comparison example.

FIG. 17 is a schematic cross section of a comparison example of a nitride semiconductor light emitting device without forming the Rh film under the Ag light reflecting electrode.

There is illustrated a structure where a GaN series semiconductor lamination (light emitting part) 2 including for example an undoped GaN layer, an n-type GaN layer doped with Si or the like, a strain relaxing layer including GaN/InGaN, a p-type AlGaN clad layer, and a p-type GaN contact layer, is formed on a sapphire substrate 1, a Ag layer 42 is formed directly thereon and patterned by etching, and a cap layer 5 is formed to cover the Ag layer 42.

The Ag layer 42 has low adhesion to GaN. Side etching proceeds during the patterning process, and the area of the contact surface of the Ag layer at the interface with the GaN series semiconductor lamination 2 becomes smaller than the front surface at the side of the cap layer 5, resulting in reverse taper shape of the side edge of the Ag layer 42.

When the cap layer 5 is formed to cover the Ag layer 42 of reverse taper shape, the cap layer 5 cannot attain sufficient coverage. For example, the Ag layer 42 may be exposed at some edge of the Ag layer 42 (as illustrated in broken line circle). Migration of Ag can proceed from this exposed portion, and may lower the device characteristics and the reliability of the device. Also, when the coverage of the cap layer 5 is insufficient, sulfurating agent may invade from some gap and may sulfurate Ag to lower the light reflectivity.

In the case of not forming Rh layer 41, the Ag layer 42 is directly formed on the GaN series semiconductor lamination 2, and the cap layer 5 is formed on the Ag layer 42, as illustrated in FIG. 17. When the reflection electrode 4 (Ag layer 42) is patterned by etching, etching proceeds more at the interface between the Ag layer 42 and the GaN series semiconductor lamination 2, since the Ag has low adhesion with GaN surface. There may be formed some portion of the Ag layer which is not covered by the cap layer 5. Migration of Ag can occur from such uncovered portion, resulting in lowered reliability and characteristics of the device.

Figure 18:
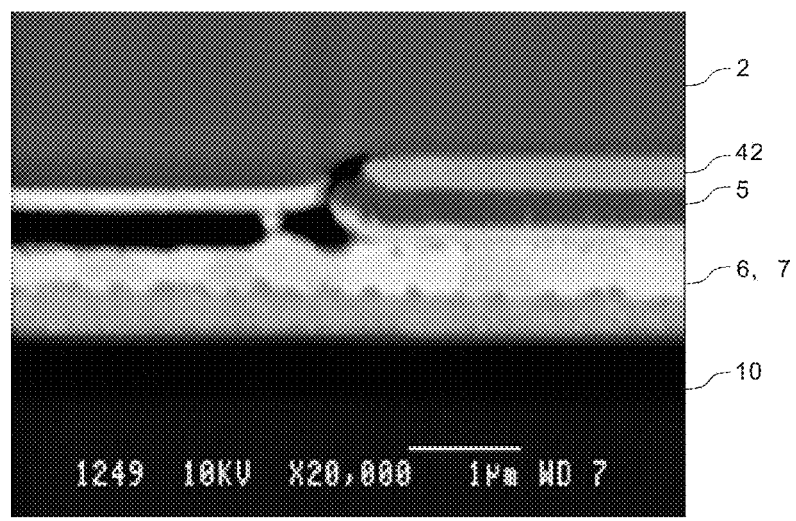
FIG. 18 is a cross sectional scanning electron microscope photograph of a nitride semiconductor light emitting diode device according to the comparison example.

FIG. 18 is a cross section SEM photograph of a nitride semiconductor light emitting device according to an comparison example manufactured to have similar structure as the embodiment of this invention without the point of not having the Rh layer 41. The Ag layer 42 has a smaller contact area at the interface with the GaN series semiconductor lamination 2 compared to the front surface area at the side of the cap layer 5, to form reverse taper at the edge of the Ag layer 42. The cap layer 5 cannot sufficiently or fully cover the Ag layer 42, and some edge portion of the Ag layer 42 is exposed.

Figure 8:
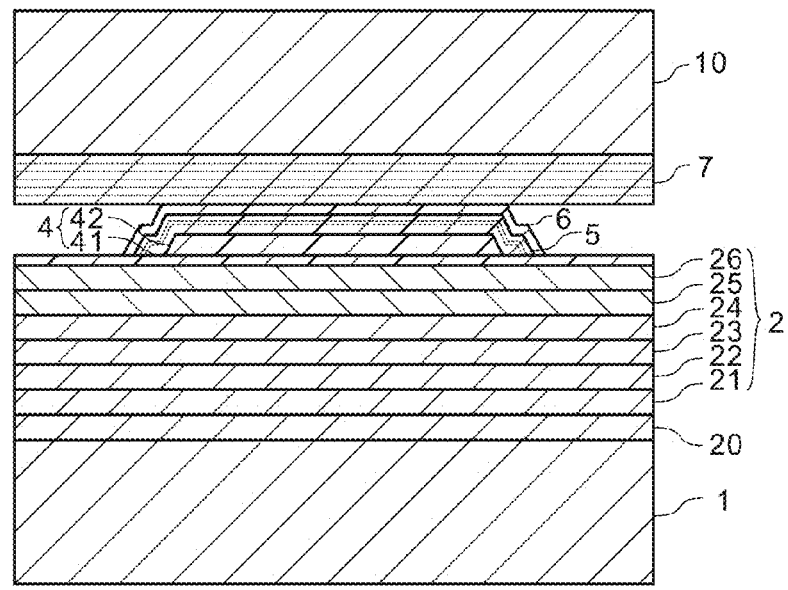

Now, description returns to the embodiment. As illustrated in FIG. 8, a Si substrate 10 having a surface deposited with a eutectic layer 7 including eutectic material of Pt/Ti/Ni/Au/Pt/AuSn is prepared. The eutectic layer 7 is abutted to the Au layer 6 of the device substrate, and thermal compression is carried out in vacuum at a pressure of 6 kN and a temperature of 330-350 C to form eutectic.

Figure 9:
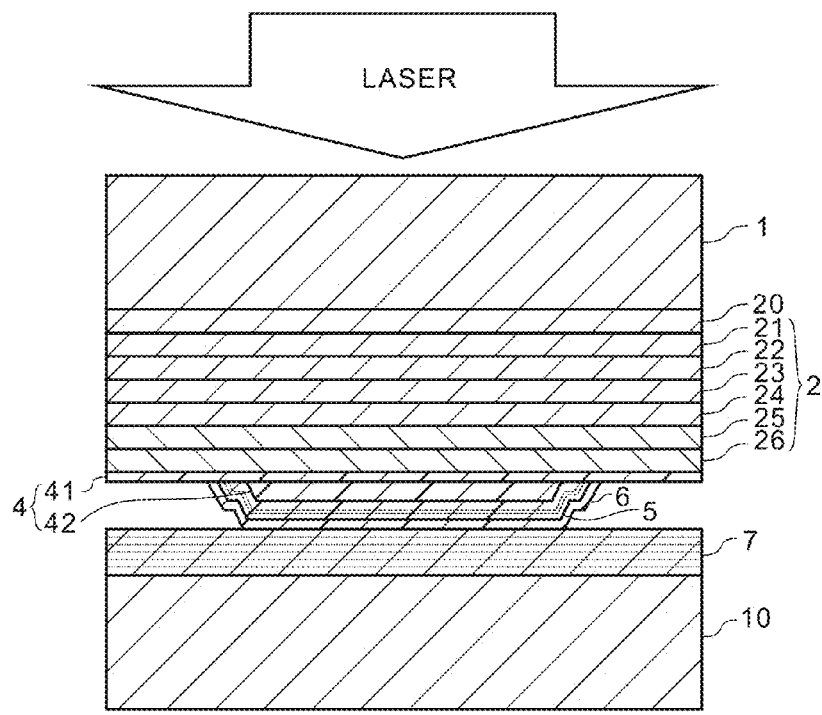
Figure 10:
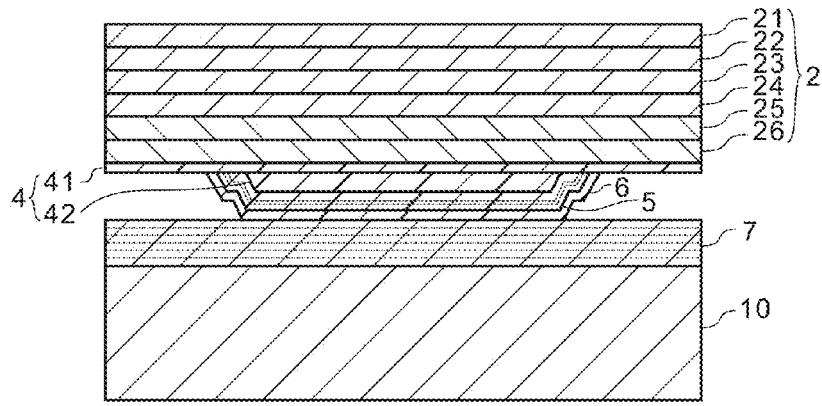

As illustrated in FIG. 9, excimer laser light is irradiated from the rear surface of the sapphire substrate 1 (on the side of the sapphire substrate) to decompose the buffer layer 20 and separate or remove the sapphire substrate 1 from the GaN series semiconductor lamination 2 (laser lift-off). Droplets or pieces of Ga generated by the laser lift-off are removed by hot water etc. and then the surface is treated with hydrochloric acid. FIG. 10 illustrates the structure where the sapphire substrate is removed. Those treatment agents which can etch nitride semiconductor, e.g. such acids as phosphoric acid, sulfuric acid, or such alkalis as KOH, NaOH, etc. may be used for surface treatment. Surface treatment can also be done by dry etching using Ar plasma or hydrochloric acid containing plasma, or by polishing.

Figure 11:
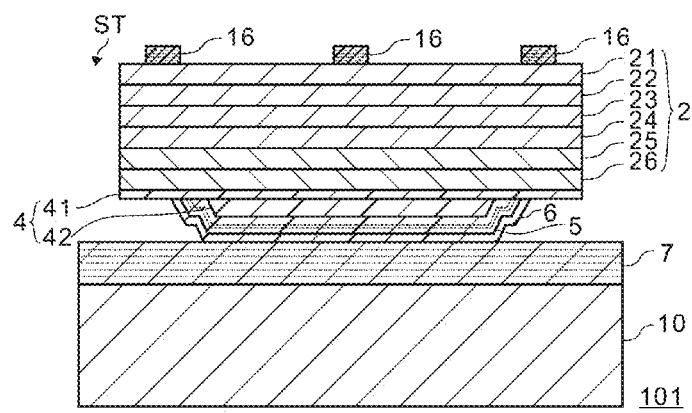

As illustrated in FIG. 11, streets ST between adjacent elements 101 are formed by patterning the GaN series semiconductor lamination 2 through photolithography and etching. Specifically, a photoresist layer is coated, selectively exposed and developed on the surface of the GaN series semiconductor lamination 2, and then unnecessary portions of the GaN series semiconductor lamination 2 are removed to form streets ST between adjacent GaN series semiconductor laminations 2. Then, the photoresist layer is removed by remover.

Lamination of Ti/Al/Ti/Pt/Au is successively deposited on the exposed n-type GaN layer 21, and is patterned to form n-side electrode (wiring electrode) 16. FIG. 11 illustrates this state. Patterning may be done by lift-off, or etching using resist mask. Preferably, n-side electrode 16 has a contact resistance of $1 \times 10^{-4}$ ohm*cm$^2$ or less. Other electrode materials may also be used provided that this condition is satisfied. The n-side electrode 16 may have stripe planar shape having an area of, for example 5%-15% of the total area of the principal surface of the GaN series semiconductor lamination 2.

Figure 12:
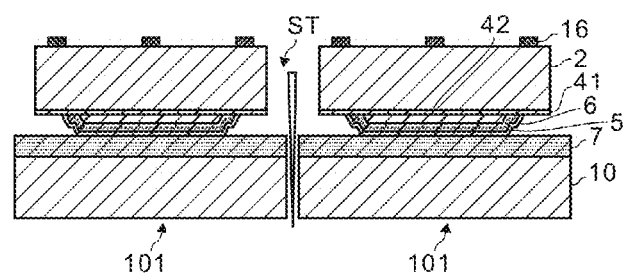

A nitride semiconductor light emitting device 101 is completed by the above processes. When a plurality of elements are made on a single substrate, the substrate is scribed and broken as illustrated in FIG. 12. For producing white light using blue GaN light emitting device, for example yellow fluorescent material is mixed in the resin which seals/fills the light emitting device.

Figure 13:
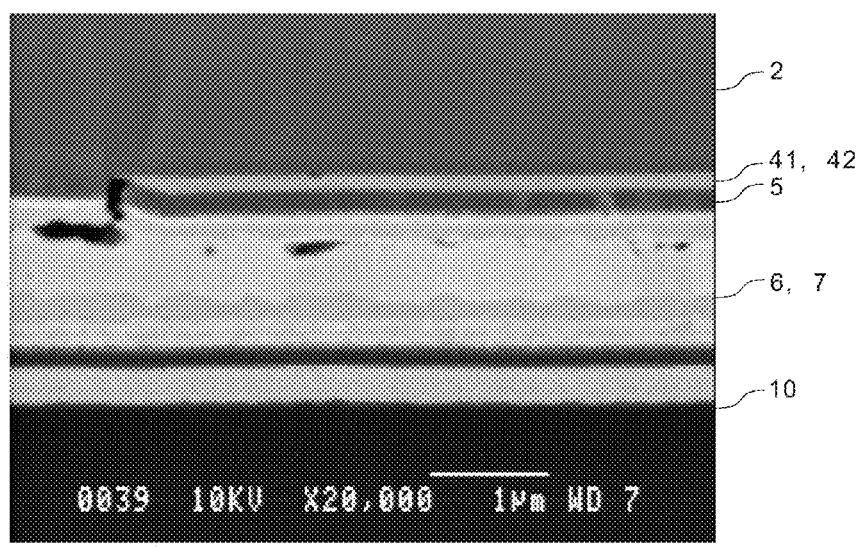
FIG. 13 is a cross sectional scanning electron microscope photograph of a nitride semiconductor light emitting diode device 101 of an example according to the embodiment of this invention.

FIG. 13 is a cross section SEM photograph of an example of a nitride semiconductor light emitting device manufactured according to an embodiment of this invention. It can be observed that the Ag layer 42 has such area which decreases from the interface with the Rh film 41 (GaN series semiconductor lamination 2 side) toward the interface with the cap layer 5, that is, it has a forward taper shape having an in-plane cross sectional area gradually decreasing with increase in the height. It can also be observed that the cap layer 5 is formed along the forwardly tapered Ag layer 42, and almost perfectly covers the Ag layer 42.

According to the above-described embodiment, a Rh film 41 having a thickness in a range of 0.1 nm to 1 nm (1 A to 10 A), more preferably a thickness in a range of 0.1 nm to 0.5 nm (1 A to 5 A) is formed on the GaN series semiconductor lamination 2, and a Ag layer 42 is formed thereon. The electrode patterning is done by etching to enable reduction of the contact resistance of the reflection electrode 4, compared to patterning the reflection electrode by lift-off. This also can raise the adhesion of the reflection electrode 4 with the GaN series semiconductor lamination 2 while maintaining high reflectivity, compared to the structure having no Rh film, while suppressing migration of Ag.

The area of the Rh film is made wider than the area of the Ag layer, and the Rh film 41 is made to enclose the Ag layer 42 in plan view. The Rh film and the cap layer encapsulate the Ag layer 42. Even when sulfurating agent tends to enter from the edge of the cap layer etc., it becomes not easy for the sulfurating agent to reach the Ag layer 42, enabling to avoid or reduce sulfuration of the Ag layer 42.

Since the adhesion of the Ag layer 42 is improved, and the etching rate of the Rh film 41 is sufficiently lower than that of the Ag layer 42, the cross sectional shape of the Ag layer 42 becomes forwardly tapered (wider near the Rh film), to enable improvement of coverage of the cap layer 5 formed thereon. Therefore, it becomes possible to suppress migration of Ag and to improve characteristics and the reliability of the device.

Figure 14:
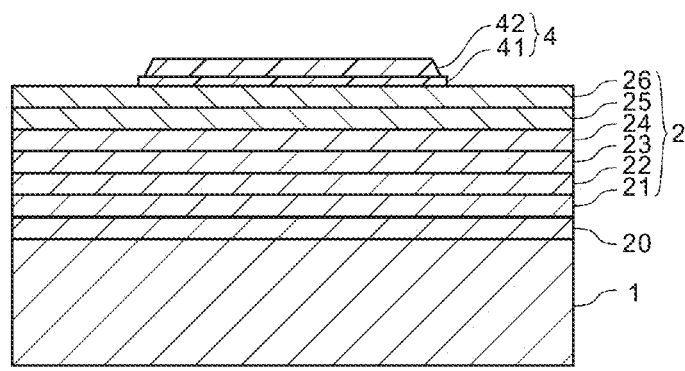
FIG. 14 is a schematic cross section illustrating a Rh film 41 according to modification of the embodiment of this invention.

In the above-described embodiment, etching process illustrated in FIGS. 4-6 is done by wet etching at room temperature (25 C). Wet etching at room temperature is preferable because the Rh film is scarcely etched. It is also possible to employ wet etching at an elevated temperature, or dry etching. In such cases, the Rh film 41 is also subjected to etching together with etching of the Ag layer 42. The etching rate of the Rh film 41 is still sufficiently slower than that of the Ag layer 42. As illustrated in FIG. 14, the area of the Rh film 41 becomes wider than the Ag layer 42, and surrounds the Ag layer 42 in plan view. When dry etching is employed, such a resist mask PR having forward taper can be made to perform etching to make the area of the Rh film 41 near the interface with the GaN to be wider than the Ag layer.

In the above-described embodiment, light reflecting electrode was made of Ag, it may also be possible to form a light reflecting electrode of Ag alloy in which such material as Se, Pd, Au, Cu, Pt, Nd, Bi etc. is mixed in Ag at about 1% or less.

Sapphire substrate was used as the growth substrate. It is also possible to use other growth substrate such as GaN substrate and SiC substrate. Also the semiconductor lamination 2 is not limited to GaN series, but may also be formed of AlGaInP, ZnO etc.

Figure 15:
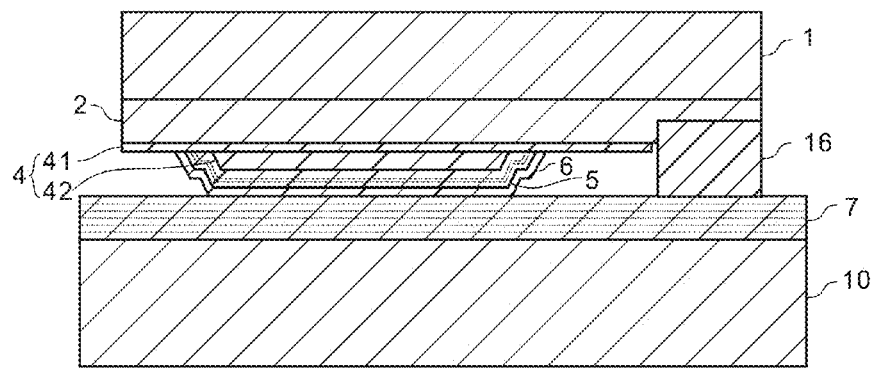
FIG. 15 is a schematic cross section illustrating device structure of a nitride semiconductor light emitting diode (LED) device of flip-chip type embodying the embodiment of this invention.
Figure 16:
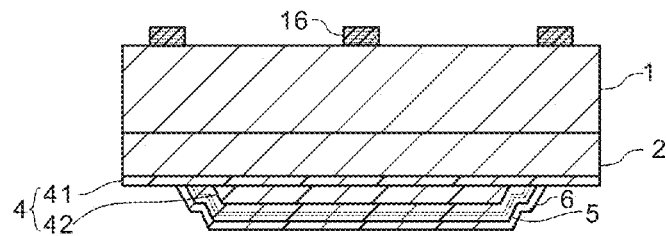
FIG. 16 is a schematic cross section illustrating device structure of a nitride semiconductor light emitting diode (LED) device of junction-down type embodying the embodiment of this invention.

Provided that the reflection electrode 4 includes an Ag containing layer, such flip-chip type structure which does not remove the growth substrate as illustrated in FIG. 15, or junction-down type structure which uses transparent and conductive substrate such as GaN substrate or SiC substrate as the growth substrate as illustrated in FIG. 16 can be employed.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What are claimed are:

1. A semiconductor light emitting device comprising:
   a semiconductor lamination including a first semiconductor layer of a first conductivity type, an active layer formed on the first semiconductor layer, and a second semiconductor layer of a second conductivity type formed on the active layer;
   a rhodium (Rh) layer formed on one surface of the semiconductor lamination;
   a light reflecting layer containing Ag, formed on the Rh layer and having an area smaller than the Rh layer; and
   a cap layer covering the light reflecting layer to encapsulate the light reflecting layer together with the Rh layer.

2. The semiconductor light emitting device according to claim 1, wherein the light reflecting layer has a larger in-plan area at a side near the Rh layer than at a side near the cap layer.

3. The semiconductor light emitting device according to claim 1, further comprising:
   a support substrate;
   a eutectic layer coupling the cap layer with the support substrate; and
   a wiring electrode layer formed on another surface of the semiconductor lamination.

4. The semiconductor light emitting device according to claim 1, wherein the Rh layer has a thickness in a range of 0.1 nm to 1 nm.

5. A method for manufacturing a semiconductor light emitting device comprising steps of:
   (a) preparing a growth substrate;
   (b) growing a semiconductor lamination on the growth substrate, including a first semiconductor layer of a first conductivity type, an active layer on the first semiconductor layer, and a second semiconductor layer of a second conductivity type on the active layer;
   (c) forming a rhodium (Rh) layer on one surface of the semiconductor lamination;
   (d) forming a light reflecting layer containing Ag on the Rh layer;
   (e) etching the light reflecting layer to pattern the light reflecting layer to be defined only within an area of the Rh layer; and to have an area smaller than the area of the Rh layer; and
   (f) forming a cap layer covering the light reflecting layer to encapsulate the light reflecting layer together with the Rh layer.

6. The method for manufacturing a semiconductor light emitting device according to claim 5, wherein the step (e) produces the light reflecting layer having in-plan area wider at a side near the Rh layer than at a side near the cap layer.

7. The method for manufacturing a semiconductor light emitting device according to claim 5, further comprising steps of:
   (g) forming a Au layer on the cap layer;
   (h) preparing a support substrate having a eutectic layer formed on one principal surface; and
   (i) abutting the Au layer with the eutectic layer, and carrying out eutectic reaction.

8. The method for manufacturing a semiconductor light emitting device according to claim 7, further comprising:

(j) removing the growth substrate; and
(k) forming a wiring electrode on a surface of the semiconductor lamination exposed in the step (j).

9. The method for manufacturing a semiconductor light emitting device according to claim 5, wherein the step (c) forms the Rh layer with a thickness in a range of 0.1 nm to 1 nm.

* * * * *